United States Patent [19]
Arai et al.

[11] Patent Number: 5,203,958
[45] Date of Patent: Apr. 20, 1993

[54] PROCESSING METHOD AND APPARATUS

[75] Inventors: Izumi Arai, Yokohama; Yoshifumi Tahara, Yamato, both of Japan

[73] Assignee: Tokyo Electron Limited, Tokyo, Japan

[21] Appl. No.: 735,277

[22] Filed: Jul. 24, 1991

[30] Foreign Application Priority Data

Jul. 31, 1990 [JP] Japan ................................. 2-203155
Jul. 31, 1990 [JP] Japan ................................. 2-203156

[51] Int. Cl.⁵ ...................... H01L 21/306; B44C 1/22; B29C 37/00; C23C 14/00
[52] U.S. Cl. ................................... 156/643; 156/345; 204/298.09; 204/298.15; 204/298.35; 204/298.38
[58] Field of Search .................. 156/345, 643, 646; 427/38, 39; 118/724, 725, 728, 50.1, 620, 58, 59; 204/192.1, 192.12, 192.32, 298.01, 298.07, 298.09, 298.15, 298.31, 298.33, 298.35, 298.38

[56] References Cited

U.S. PATENT DOCUMENTS

| | | | |
|---|---|---|---|
| 4,771,730 | 9/1988 | Tezuka | 118/724 X |
| 4,832,781 | 5/1989 | Mears | 118/724 X |
| 4,931,135 | 6/1990 | Horiuchi et al. | 156/345 X |
| 5,078,851 | 6/1992 | Nishihata et al. | 204/298.34 |

Primary Examiner—William A. Powell
Attorney, Agent, or Firm—Oblon, Spivak, McClelland, Maier & Neustadt

[57] ABSTRACT

A processing method includes the steps of placing an object to be processed on a susceptor arranged in a hermetic container, preliminarily introducing a small amount of heat transfer medium gas to a gap between the object to be processed and the susceptor while evacuating the gap, introducing the heat transfer medium gas to the gap until a pressure thereof reaches a predetermined value while controlling the pressure thereof by controlling an evacuation amount from the gap, and processing the object to be processed.

24 Claims, 7 Drawing Sheets

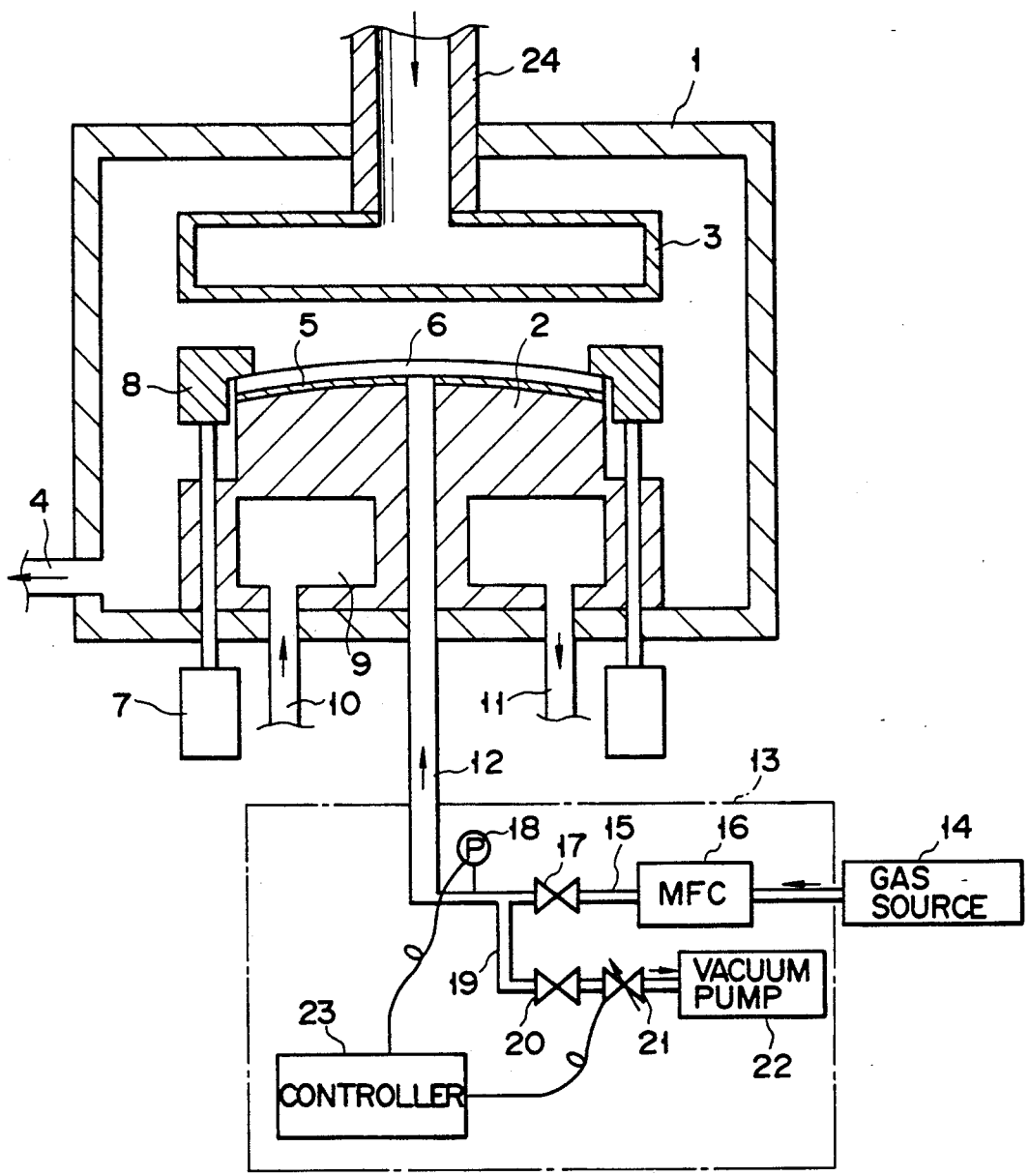
F I G. 1

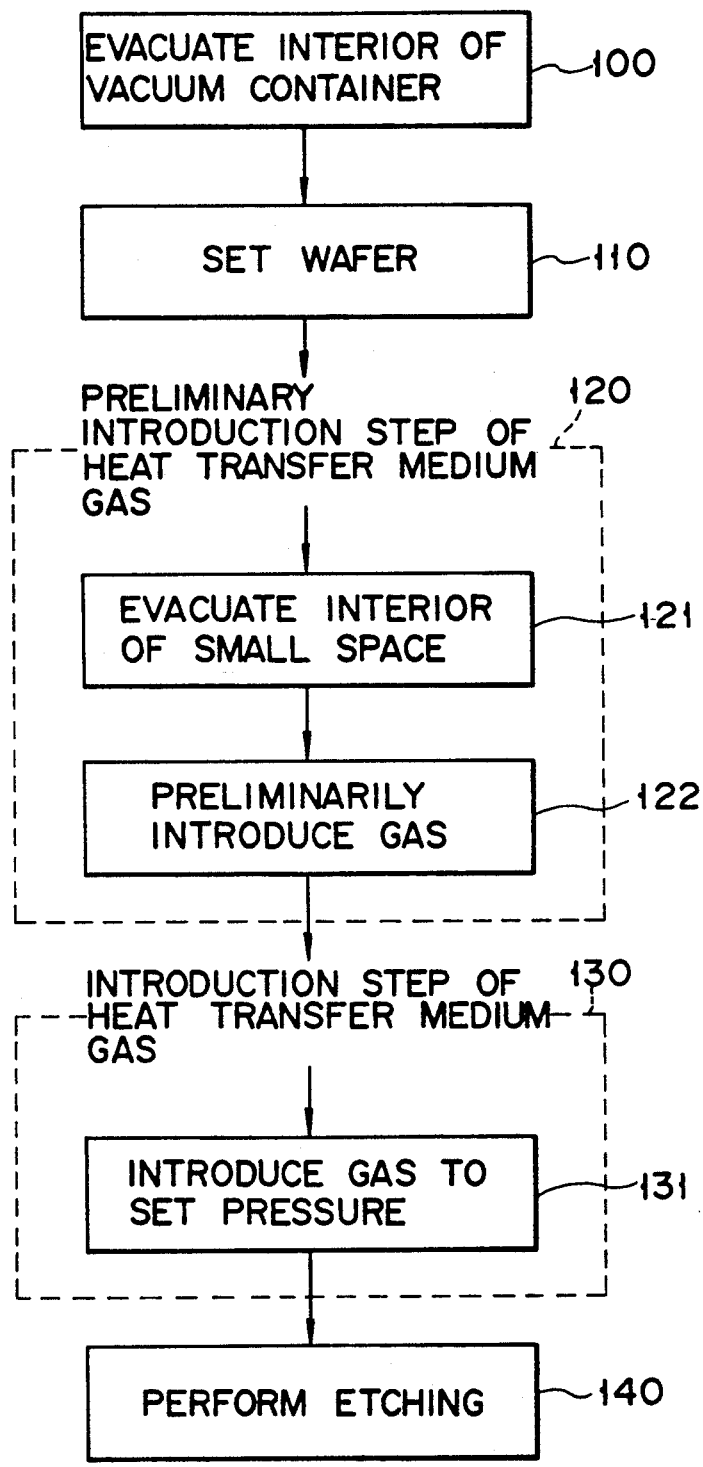
F I G. 2

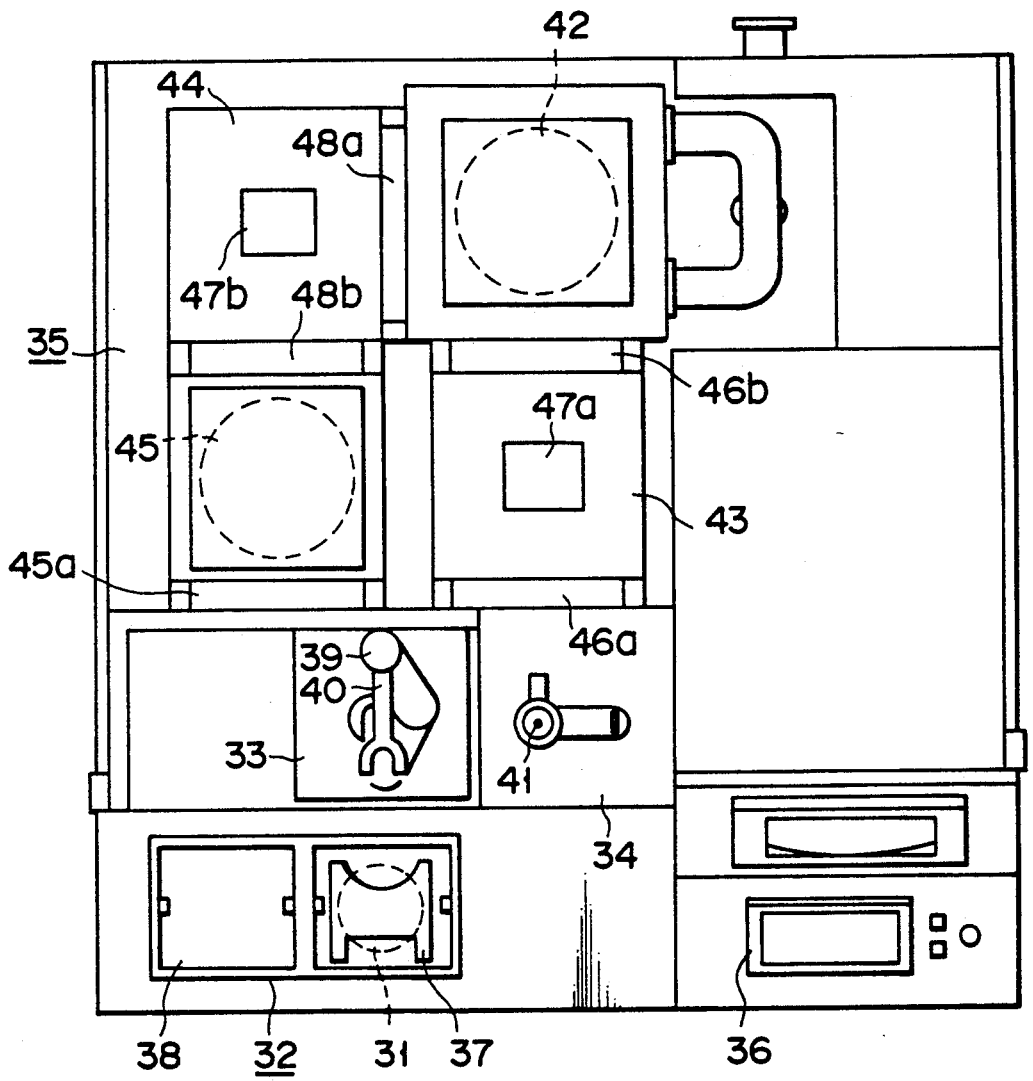
F I G. 5

PROCESSING METHOD AND APPARATUS

BACKGROUND OF THE INVENTION

1. Field of the Invention

The present invention relates to a processing method and, more particularly to a processing method suitable for manufacturing a semiconductor device.

2. Description of the Related Art

Generally, in the manufacturing steps of a semiconductor device, various types of semiconductor manufacturing apparatuses, e.g., an etching apparatus, an ashing apparatus, an ion-implanting apparatus, and a sputtering apparatus, that process a semiconductor wafer under a reduced pressure are used. In such an apparatus, usually, a semiconductor wafer as an object to be processed is placed on a lower electrode, of a pair of opposing electrodes (upper and lower electrodes), which serves also as the susceptor. A DC or RF power is applied across the electrodes in vacuum or in a reduced-pressure atmosphere to generate a plasma between the electrodes. A desired processing such as etching and ashing is performed by utilizing the plasma.

In the various processing apparatuses as described above, if the temperature of a semiconductor wafer is increased in the processing steps, the physical characteristics and the like of the semiconductor wafer may be changed to decrease the uniformity of the processing. In order to prevent this, a cooling jacket or the like is provided to the susceptor, and processing is performed while cooling the semiconductor wafer.

Generally, a small space exists between the susceptor and the lower surface of the semiconductor wafer due to the roughness of the lower surface of the semiconductor wafer. During processing in the reduced-pressure atmosphere, the pressure of this small space is also reduced. Therefore, if the semiconductor wafer is indirectly cooled by a medium in the cooling jacket, as described above, heat transfer is greatly reduced due to the presence of the pressure-reduced small space, and the semiconductor wafer cannot be effectively cooled.

It is proposed to provide an elastic insulating film on the susceptor, to hermetically seal the periphery of the semiconductor wafer placed on the elastic insulating film, and to introduce a gas as a heat transfer medium into the space between the elastic insulating film and the lower surface of the semiconductor wafer, thereby preventing the decrease in cooling efficiency.

However, in the conventional processing apparatus described above, introduction of a gas into the space is controlled only by flow rate regulation. Therefore, when the pressure at the initial stage of the gas introduction is increased, the clamped state of the semiconductor wafer becomes non-uniform, and the semiconductor wafer may be deformed or damaged to spoil the hermetic state.

When the semiconductor wafer is deformed, a distance the between the electrode and the central portion of the semiconductor wafer and that between the electrode and the peripheral portion of the semiconductor wafer become different, and the temperature distribution of the semiconductor wafer becomes easily non-uniform.

Furthermore, in the conventional processing apparatus as described above, e.g., the portion above the semiconductor wafer is positively charged. When the charges exceed the threshold voltage of the elastic insulating film, discharge occurs from the electrode side. Then, the elastic insulating film causes an insulation breakdown, and the processing quality of the semiconductor wafer is degraded, resulting in a defective semiconductor wafer.

The thickness of an elastic insulating film itself cannot be greatly increased from the viewpoint of uniformity during clamping and cooling efficiency, and is set, e.g., about 100 $\mu$m. Hence, it is strongly demanded to increase the threshold voltage without greatly increasing the elastic insulating film, thereby preventing discharge from the electrode side.

SUMMARY OF THE INVENTION

It is an object of the present invention to provide a processing method wherein, when a gas as a heat transfer medium is introduced in a space between an object to be processed and a susceptor for holding the object so as to process the object to be processed, an abnormality in pressure in a space between the object to be processed and the susceptor is prevented, thereby uniformly processing the object to be processed.

It is another object of the present invention to provide a processing apparatus for processing an object to be processed by using a plasma, wherein an elastic film applied on the surface of a susceptor is prevented from being damaged.

According to the present invention, there is provided a processing method comprising the steps of placing an object to be processed on a susceptor arranged in a hermetic container, preliminarily introducing a small amount of heat transfer medium gas into the gap between the object to be processed and the susceptor, introducing the heat transfer medium gas to the gap until a pressure thereof reaches a predetermined value while controlling the pressure of the heat transfer medium gas in the gap, and processing the object to be processed.

According to the present invention, there is also provided a processing apparatus comprising a first electrode constituting a susceptor for holding an object to be processed thereon, a second electrode arranged to oppose the first electrode, and means for generating a plasma between the first and second electrodes and processing the object to be processed by the plasma, wherein an inorganic insulating film is formed on the first electrode, and an elastic insulating film is formed on the inorganic insulating film.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of an etching apparatus used in an etching method according to one embodiment of the present invention FIG. 2 is a flow chart of the etching method according to one embodiment of the present invention;

FIG. 5 is a view showing the arrangement of the etching apparatus shown in FIG. 4;

DETAILED DESCRIPTION OF THE PREFERRED EMBODIMENTS

Figure 3:
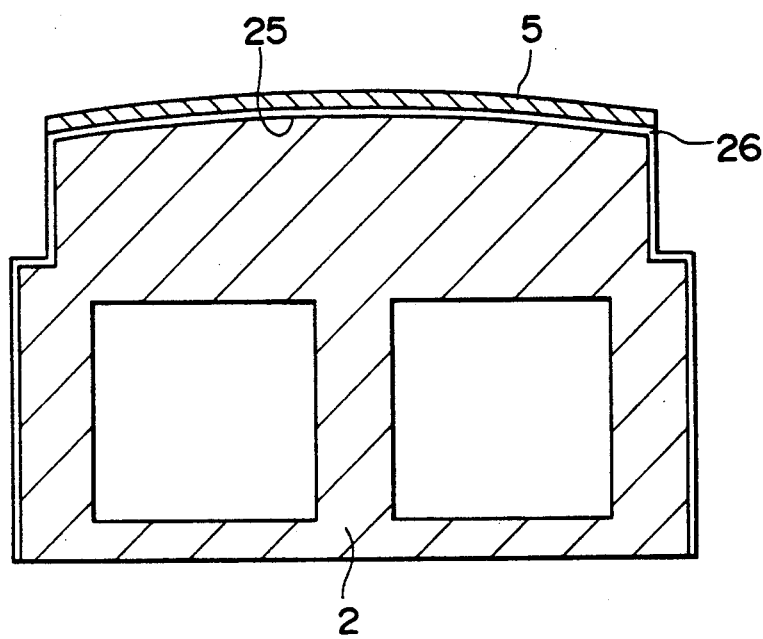
FIG. 3 is a sectional view showing a susceptor of the etching apparatus according to another embodiment of the present invention.

Various embodiments in which the present invention is applied to etching of a semiconductor wafer will be described with reference to the accompanying drawings.

FIG. 1 is a sectional view showing an etching apparatus used in an etching method according to one embodiment of the present invention. Referring to FIG. 1, a susceptor 2 which serves also as a first electrode (lower electrode) made of aluminum or the like and having, e.g., an anodized aluminum film, and a second electrode 3 (upper electrode) are arranged to oppose each other in a vacuum container 1, e.g., a metal container. An exhaust system 4 capable of evacuating the interior of the vacuum container 1 to a predetermined vacuum state, e.g., several tens of mTorr to several tens of Torr, is connected to the vacuum container 1.

The upper surface of the susceptor 2 is formed to project in a spherical manner, e.g., to have a uniformly distributed load surface in order to increase the tight-contactness with the lower surface of the wafer. An elastic film 5 comprising, e.g., Capton (tradename for a polyimide-based resin) having a thickness of, e.g., about 25 μm, is adhered on the upper surface of the susceptor 2 with, e.g., an acryl-based adhesive (film thickness: 10 to 15 μm). An object to be processed, e.g., a semiconductor wafer 6 is placed on the elastic film 5. The elastic film 5 is provided for the purpose of making constant the impedance between the semiconductor wafer 6 and the susceptor 2 serving also as the lower electrode. More specifically, the impedance between the semiconductor wafer 6 and the susceptor 2 becomes nonuniform as it depends on the gap between them. When the elastic film 5 having a high insulating property is provided between them, the impedance between them is determined more by the elastic film 5 rather than by the gap between their surfaces and becomes constant.

A clamp ring 8 is provided around the susceptor 2 capable of being elevated by a drive device 7 such as an air cylinder. When the periphery of the semiconductor wafer 6 is urged against the elastic film 5 by the clamp ring 8, the semiconductor wafer 6 is held on the susceptor 2 with a predetermined clamp load.

The upper surface of the susceptor 2 projects to form a curved surface substantially the same as the deformed curved surface (uniform load curved surface) of the semiconductor wafer 6 under an assumption that the clamp load applied to the periphery of the semiconductor wafer 6 with the clamp ring 8 is a uniform load obtained by fixing the periphery of the semiconductor wafer 6.

The susceptor 2 holds the semiconductor wafer 6 capable of being cooled. A cooling jacket 9 is incorporated inside the susceptor 2. The cooling jacket 9 is connected to an inlet pipe 10 and an exhaust pipe 11 of a cooling medium. When the cooling medium, e.g., cooling water, is circulated in the cooling jacket 9 through the inlet pipe 10 and the exhaust pipe 11, the semiconductor wafer 6 is cooled.

A small space is inevitably formed, when viewed microscopically, between the elastic film 5 on the susceptor 2 and the semiconductor wafer 6 due to the surface roughness of the lower surface of the wafer. A gas inlet pipe 12 extends through the central portion of the susceptor 2 in order to introduce, into the small space, a gas as a medium for aiding heat transfer between the susceptor 2 and the semiconductor wafer 6. The gas inlet pipe 12 is connected to a gas source 14 through a pressure regulating device 13 arranged outside the vacuum container 1, as shown in FIG. 1.

A flow rate regulator 16, a main opening/closing valve 17, and a pressure gauge 18 are provided to a main piping 15 in the pressure regulating device 13 connected to the gas inlet pipe 12 in the order named from the gas source 14 side. A sub piping 19 is connected between the main opening/closing valve 17 and the pressure gauge 18 of the main piping 15. The sub piping 19 is connected to a vacuum pump 22 through a sub opening/closing valve 20 and a pressure regulating valve 21. The pressure regulating valve 21 is automatically controlled by a controller 23 in accordance with a control program depending on the pressure of the small space between the elastic film 5 and the semiconductor wafer 6 which is measured by the pressure gauge 18. The main and sub opening/closing valves 17 and 20 are interlocked with each other.

An inert gas such as nitrogen gas, helium, and argon is usually used as the heat transfer medium. A reactive gas and the like used in processing a semiconductor wafer can also be used. Since the gas is used to prevent heat insulation, the type of the gas is not limited.

The upper electrode 3 of a container shape is connected to a reactive gas supply pipe 24. Pores (not shown) are formed in the lower surface of the upper electrode 3 opposed to the lower electrode 2. A processing gas, e.g., argon gas, can flow into the vacuum container 1 through the pores.

A plasma is generated between the upper electrode 3 and the susceptor 2 as the lower electrode by a high frequency power of 380 KHz, 13.56 MHz, etc., from a high frequency source (not shown). The susceptor 2 in this embodiment is electrically grounded. However, a voltage can be applied without electrically grounding the susceptor 2. For example, power of a different phase may be applied across the upper and lower electrodes 2 and 3.

The etching processing steps by using the etching apparatus having the arrangement as described above will be described with reference to FIG. 2.

The interior of the vacuum container 1 is evacuated to a predetermined vacuum state, as indicated by step 100 of FIG. 2. Then, the semiconductor wafer 6 is placed on the susceptor 2 and held with a predetermined clamp load, as indicated by step 110.

A gas as a heat transfer medium is introduced into the small space between the elastic film 5 and the semiconductor wafer 6 placed on the susceptor 2 through the gas inlet pipe 12. The heat transfer medium gas is introduced in accordance with the following steps.

First, the step of preliminarily introducing the heat transfer medium gas indicated by step 120 is performed. Prior to gas introduction, the heat transfer medium gas supplied from the gas source 14 at a pressure of e.g., about 0.7 kg/cm$^2$ to 1.0 kg/cm$^2$, is regulated to a predetermined flow rate, e.g., about 0 to 20 SCCM by the flow rate regulator 16. More specifically, the main opening/closing valve 17 is closed, the sub opening/closing valve 20 and the pressure regulating valve 21 are opened, and the vacuum pump 22 is turned on to reduce the pressure of the small space (step 121).

Subsequently, the main opening/closing valve 17 is open while continuing evacuation, so that the heat transfer medium gas is gradually introduced into the small space from the gas inlet pipe 12 through the main piping 15 (step 121). During gas introduction, the evacuation volume is adjusted such that the heat transfer medium gas is gradually supplied into the small space.

After the gas preliminary introduction step 120 is completed, the introduction step 130 of the heat transfer medium gas is performed. The heat transfer medium gas is supplied into the small space from the gas inlet pipe 12 up to a predetermined pressure (step 131).

When the pressure inside the small space reaches a predetermined level by the gas introduction steps, a predetermined RF power is applied to the upper electrode 3 in order to generate a plasma between the upper electrode 3 and the susceptor 2 serving as the lower electrode, and predetermined etching is performed (step 140). In the etching step, the temperature of the semiconductor wafer 6 is increased as the semiconductor wafer 6 is exposed to the generated plasma and is subjected to etching. However, heat is transmitted between the semiconductor wafer 6 and the susceptor 2 through the heat transfer medium gas introduced into the small space. The susceptor 2 is also cooled by the cooling water circulated in the cooling jacket 9. As a result, the temperature of the semiconductor wafer 6 is maintained to fall within a predetermined range.

The periphery of the semiconductor wafer 6 is urged against the susceptor 2 by the clamp ring through the elastic film 5. Therefore, the heat transfer medium gas is sealed in the small space. As the processing progresses, the heat transfer medium gas leaks. When the pressure inside the small space becomes a predetermined level or lower than that, the pressure regulating valve 21 is closed and the heat transfer medium gas is supplied up to a predetermined pressure. In this manner, the interior of the small space is constantly maintained to a predetermined pressure, e.g., of 0.5 to 20 Torr.

The pressure of the gas introduced in the small space is set such that the distance between the semiconductor wafer 6 and the susceptor 2 is substantially uniform throughout the entire surface of the semiconductor wafer 6. This is because the heat transfer amount is determined by this distance. More specifically, if the introduction pressure for the heat transfer medium gas is set excessively high, only the distance between the central portion of the semiconductor wafer 6, where the gas inlet pipe 12 is arranged, and the susceptor 2 becomes large, and the uniformity in temperature distribution of the semiconductor wafer 6 is degraded. Practically, the gas introduction pressure is preferably set lower than a gas pressure at which the thermal conductivity saturates. For example, if the thermal conductivity saturates at a gas pressure of about 20 Torr, the gas introduction pressure is preferably set at about 10 Torr. In this case, the preferable distance is 20 to 200 μm.

In this manner, according to the etching method of this embodiment, before the heat transfer medium gas is introduced into the small space between the elastic film 5 and the semiconductor wafer 6 placed on the susceptor 2, the heat transfer medium gas is preliminarily supplied to a pressure-reduced space as the gas preliminary introduction step, thereby preventing gas from being abruptly charged into the small space. After the gas preliminary introduction step is completed, the heat transfer medium gas is supplied up to the predetermined pressure. Hence, an abrupt pressure increase in the small space is prevented, and the heat transfer medium gas can be introduced up to the predetermined pressure while gradually increasing the pressure.

As a result, a displacement of a clamp from the semiconductor wafer 6 due to abrupt gas charging can be prevented, and the semiconductor wafer 6 may not be deformed or damaged. Since the stability of the clamp state of the semiconductor wafer 6 during processing is increased, the uniformity in temperature distribution of the semiconductor wafer 6 can be increased.

The introduction amount of heat transfer medium gas into the small space is controlled by pressure, and this pressure is maintained at a predetermined level. Therefore, the heat transfer state between the susceptor 2 and the semiconductor wafer 6 during the processing steps can be well maintained constantly. As a result, the semiconductor wafer 6 can be cooled efficiently and stably, thereby efficiently performing stable treatment, i.e., etching processing.

FIG. 3 is a sectional view showing a lower electrode used in an etching apparatus according to another embodiment of the present invention. The etching apparatus shown in FIG. 3 is different from that shown in FIG. 1 only in the structure of the susceptor 2 constituting the lower electrode. Apart from that, the apparatus of FIG. 3 is the same as that of FIG. 1 and the detailed description thereof is omitted.

The susceptor 2 shown in FIG. 3 that constitutes the lower electrode is made of an electrically conductive metal material such as aluminum. An insulating oxide film, i.e., an anodized aluminum film 26 containing aluminum oxide as the major component is formed on the surface of the lower electrode 2 including an upper surface 25 on which an object to be processed is placed. An elastic insulating film 5 comprising Capton (tradename for a polyimide-based resin) having a thickness of about 25 μm is adhered to the anodized aluminum film 26 formed on the upper surface 25 of the lower electrode 2 in the same manner as the lower electrode shown in FIG. 1. An object to be processed, e.g., a semiconductor wafer 6, is placed on the elastic insulating film 5.

The thickness of the anodized aluminum film 26 is appropriately determined by considering the thickness of the elastic insulating film 5. For example, when the thickness of the elastic insulating film 5 is 25 to 100 μm, the thickness of the anodized aluminum film 26 is 10 to 200 μm. In this embodiment, the thickness of the anodized aluminum film 26 was set at 50 μm while that of the elastic insulating film 5 was set at 25 to 100 μm.

It is preferable that the thickness of each of the anodized aluminum film 26 and the elastic insulating film 6 be set at a level not extremely interfering with the generation of the plasma due to the presence of insulating materials between the electrodes 2 and 3.

In the etching apparatus show in FIG. 3, even if the semiconductor wafer 6 is positively charged, the elastic insulating film 5 does not cause an insulation breakdown, due to the presence of the anodized aluminum film 26.

Figure 4:
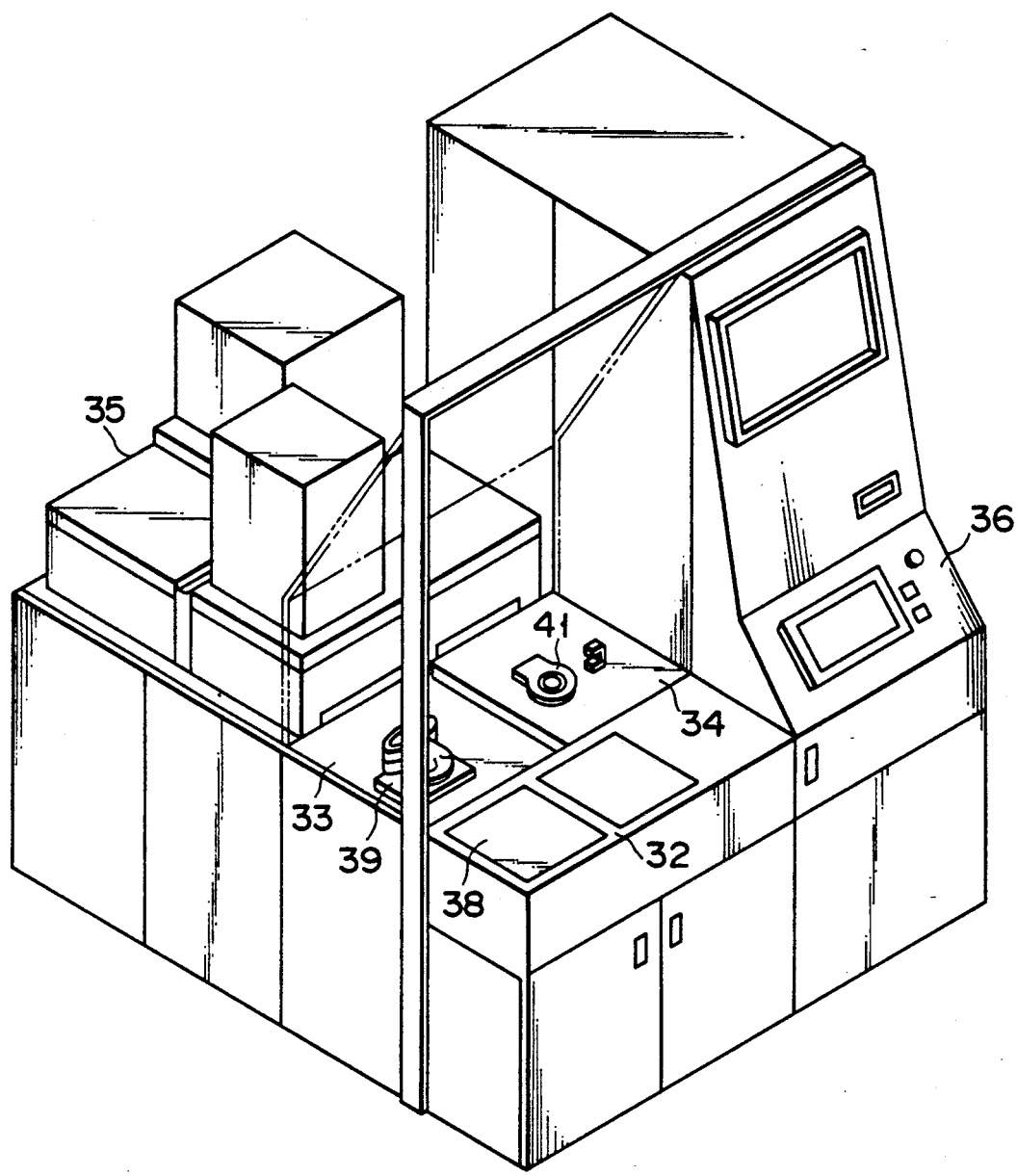
FIG. 4 is a perspective view showing an etching apparatus having a loader and an unloader according to still another embodiment of the present invention.
Figure 6:
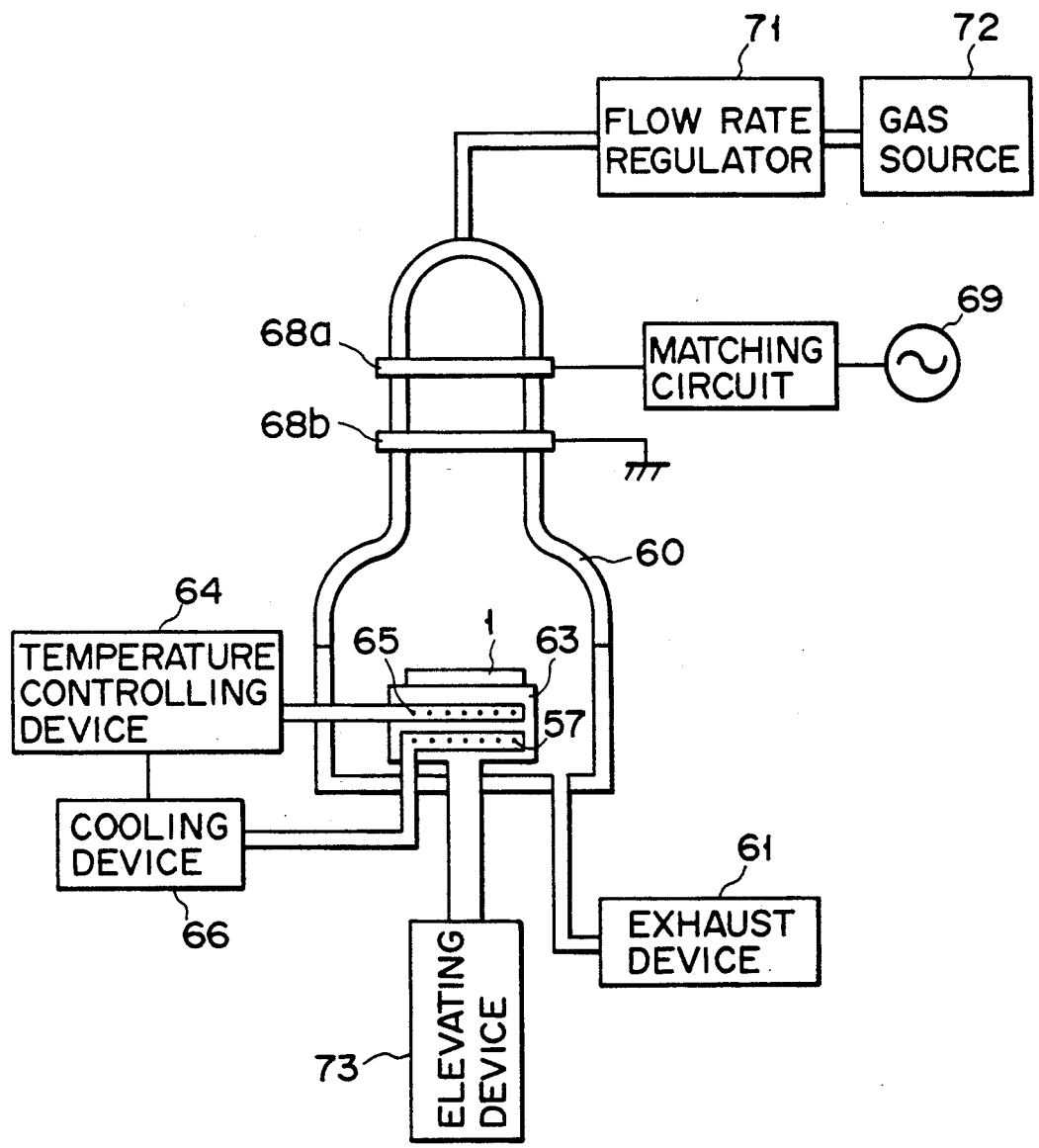
FIG. 6 is a view showing a plasma etching-ashing apparatus as part of the etching apparatus shown in FIG. 4.

FIG. 4 is a perspective view showing another embodiment of a plasma etching-ashing apparatus having a loader/unloader section according to the present invention. FIG. 6 shows the arrangement of the plasma etching-ashing apparatus shown in FIG. 5.

The plasma etching-ashing apparatus shown in FIGS. 4 and 5 has a housing section 32, a feed section 33, an alignment section 34, a processing section 35, and an operating section 36. The housing section 32 houses a semiconductor wafer. The feed section 32 feeds the semiconductor wafer out from and to the housing section 32. The semiconductor wafer supplied from the feed section 33 is aligned at the alignment section 34. The processing section 3 etches/ashes the semiconductor wafer aligned at the alignment section 34. The operating section 36 sets the operation of these sections and monitors them. The housing section 32, the feed section 33, and the alignment section 34 constitute a loader/unloader section.

The loader/unloader section will be described first. A wafer cassette 37 capable of storing a plurality of, e.g., 25 semiconductor wafers in the direction of thickness at predetermined gaps and a cassette table 38 on which the wafer cassette 37 is placed are arranged at the housing section 32, as shown in FIG. 5. The cassette table 38 can be vertically moved by an elevating device (not shown). The elevating device is preferably located constantly below the cassette table 38 for the purpose of dust prevention.

A multijoint robot 39 is provided to the feed section 33 for feeding a semiconductor wafer between the alignment section 34 and the processing section 35. The multijoint robot 39 has an arm 40 having a wafer holding device (not shown), e.g., a vacuum chuck device. The arm 40 is made of a material, e.g., ceramic and quartz glass, that does not cause heavy metal contamination to a semiconductor wafer. The multijoint robot 39 is pivotal about one point and movable in the direction of the horizontal axis.

The alignment section 34 has a vacuum chuck 41. The vacuum chuck 41 comprises a disk chuck and a ring chuck. The vacuum chuck 41 also has a sensor, e.g., a transmission type sensor, for detecting the periphery of a wafer.

A first processing chamber 42, an inlet side load-lock chamber 43, an intermediate load-lock chamber 44, and a second processing chamber 45 are arranged in the processing section 35. A semiconductor wafer is etched in the first processing chamber 42. The inlet side and intermediate load-lock chambers 43 and 44 feed a semiconductor wafer to the first processing chamber 42. The second processing chamber 45 is connected to the intermediate load-lock chamber 43. In the second processing chamber 45, a semiconductor wafer processed in the first processing chamber 42 is subjected to processing such as isotropic etching and resist ashing.

An opening/closing device 46a for opening/closing an inlet port for receiving a semiconductor wafer is provided at a side wall of the inlet side load-lock chamber 43 on the alignment section 34 side. An opening/closing device 46b for opening/closing an inlet port for receiving a semiconductor wafer is provided to a side wall of the chamber 43 on the first processing chamber 42 side. A handling arm 47a is provided to the inlet side load-lock chamber 43 for exchanging a semiconductor wafer between the alignment section 34 and the first processing chamber 42.

Each of the load-lock chambers 43 and 44 is connected to a vacuum exhaust device (not shown), e.g., a rotary pump and has a purge device (not shown) capable of introducing an inert gas, e.g., a nitrogen gas.

The first processing chamber 42 is made of, e.g., aluminum. The chamber 42 is covered with anodized aluminum and has a cylindrical shape.

Note that the internal device and the gas inlet device of the first processing chamber 42 have the same arrangement as those of the etching apparatus shown in FIG. 1.

The second processing chamber 45 has an arrangement as shown in FIG. 6. More specifically, a pair of parallel plate electrodes 68a and 68b are arranged in the upper portion of the cylindrical processing container 60 to oppose each other. The electrode 68a is connected to an RF power source 69, that oscillates at, e.g., 13.56 MHz, through a matching circuit. The other electrode 68b is grounded.

A susceptor 63 is arranged in the processing container 60 for chucking and holding a semiconductor wafer by means of, e.g., vacuum chuck. The susceptor 63 incorporates a heater 65 controlled by a temperature controlling device 64 and a cooling water circulating piping 67 controlled by a cooling device 66. The susceptor 63 can be vertically moved by an elevating device 73.

A gas source 72 is connected to the upper end of the processing housing 60 through a flow rate regulator 71. An exhaust hole (not shown) is formed in the lower portion of the processing container 60 for allowing the gas to flow from the central portion of the susceptor 63 to the outside, and an exhaust device 61 is connected to the exhaust hole. A purge gas source (not shown) is connected to the lower portion of the processing container 60.

The operating section 36 is provided for monitoring the operations of the respective mechanisms arranged in the above manner and the processing state of a semiconductor wafer. The operating section 36 comprises a control section (not shown) comprising a microcomputer controller, a memory section, and an input/output section. The software of the operating section 36 is programmed by using, e.g., the C language.

In the above embodiments, the method and apparatus of the present invention are applied to an etching method and an apparatus for the same. However, the present invention is not limited to it, and is effectively used in various types of semiconductor manufacturing methods and apparatuses, e.g., a plasma CVD method and apparatus a ion implantation method and apparatus and a sputtering method and apparatus, that process a semiconductor wafer in a reduced pressure to obtain the same effect as that of the etching method and apparatus described above. The object to be processed is not limited to a semiconductor, and a TFT circuit as a liquid crystal element drive circuit for amorphous Si can be fabricated with the method and apparatus of the present invention.

Figure 7:
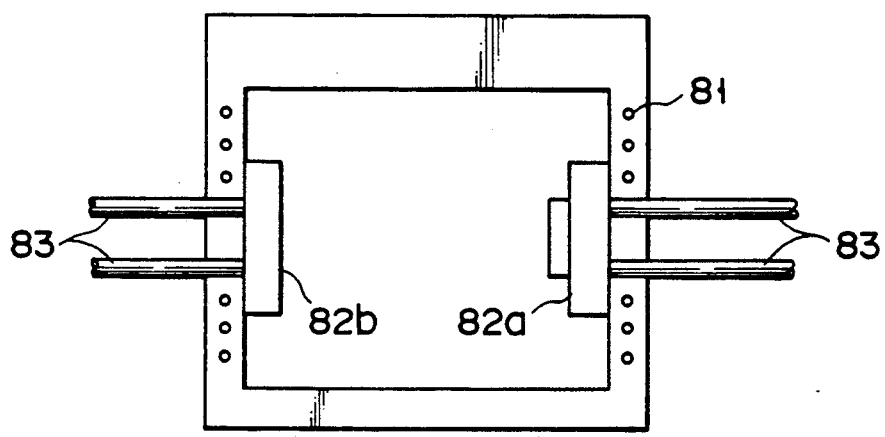
FIG. 7 is a view showing an apparatus having a vacuum container, the inner wall of which is heated.

In the above embodiments, the object to be processed is uniformly cooled. However, the present invention is not limited to this and can be applicable as far as heat control is concerned, e.g., a case in which an object to be processed is uniformly heated. For example, the inner wall of the container is usually heated by a heater 81 in order to prevent a reaction product formed by processing from attaching the inner surface of the container, as shown in FIG. 7. In this case, electrodes 82a and 82b are heated through the container inner wall so as to prevent the reaction product from attaching the exposed electrodes 82a and 82b as well. At this time, a gas inlet pipe 83 can be provided between the container inner wall and the electrode 82a, and a gas is introduced through the inlet pipe 83, thereby efficiently heating the electrodes 82a and 82b. The present invention can be applied to this case in order to uniformly heat the electrodes 82 and 82b and to prevent an electrode from displacement or being damaged.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A processing method, comprising the steps of:
   evacuating a hermetic container;
   placing an object to be processed on a susceptor arranged in said hermetic container;
   preliminarily introducing a small amount of heat transfer medium gas into a gap between the object to be processed and said susceptor;
   measuring a pressure of the heat transfer medium gas in the gap;
   automatically controlling further introduction of the heat transfer medium gas into the gap depending on the measured pressure of the heat transfer medium gas so that the pressure of the heat transfer medium gas reaches a predetermined value; and
   processing the object to be processed.

2. A processing method, comprising the steps of:
   evacuating a hermetic container;
   placing an object to be processed on a susceptor arranged in said hermetic container;
   automatically preliminarily introducing a small amount of heat transfer medium gas into a gap between the object to be processed and said susceptor;
   measuring a pressure of the heat transfer medium gas in the gap;
   automatically controlling further introduction of the heat transfer medium gas into the gap by controlling an evacuation amount from said gas inlet pipe depending on the measured pressure of the heat transfer medium gas so that the pressure of the heat transfer medium gas reaches a predetermined value; and
   processing the object to be processed.

3. A method according to claim 1, wherein the heat transfer medium gas is a gas selected from the group consisting of nitrogen, helium, and argon.

4. A method according to claim 1, wherein said susceptor and the object to be processed have uniform load curved surfaces opposing each other.

5. A method according to claim 1, wherein said susceptor and the object to be processed have opposing faces on which a synthetic resin film is formed.

6. A processing method according to claim 2, further comprising the step of:
   evacuating said gap and said gas inlet pipe after placing the object to be processed on the susceptor and before preliminary introducing a small amount of heat transfer medium gas.

7. A method according to claim 1, selected from the group consisting of etching, ashing, ion implantation, and sputtering.

8. A processing apparatus, comprising:
   a first electrode constituting a susceptor for holding an object to be processed thereon;
   a second electrode arranged to oppose said first electrode;
   means for generating a plasma between said first and second electrodes and processing the object to be processed by the plasma;
   means for automatically introducing a heat transfer medium gas into a gap between the object to be processed and said first electrode;
   means for measuring a pressure of the heat transfer medium gas in the gap; and
   means for automatically controlling further introduction of the heat transfer medium gas into the gap depending on the measured pressure of the heat transfer medium gas so that the pressure of the heat transfer medium gas reaches a predetermined value;
   wherein an inorganic insulating film is formed on said first electrode, and an elastic insulating film is formed on said inorganic insulating film.

9. An apparatus according to claim 8, wherein said inorganic insulating film is an oxide film obtained by oxidizing a surface of said first electrode.

10. An apparatus according to claim 8, wherein said first electrode is made of aluminum, and said inorganic insulating film is an aluminum oxide film.

11. An apparatus according to claim 8, wherein said first electrode and the object to be processed have opposing uniform load curved surfaces.

12. An apparatus according to claim 8, wherein said inorganic insulating film and the object to be processed have opposing surfaces on which a synthetic resin film is formed.

13. An apparatus according to claim 8, further comprising means for holding the object to be processed by urging a periphery thereof against said susceptor.

14. An apparatus according to claim 8, selected from the group consisting of an etching apparatus, an ashing apparatus, an ion implantation apparatus, and a sputtering apparatus.

15. A heat transfer method, comprising the steps of:
    evacuating a hermetic container;
    placing an object to which heat is transferred on a base material arranged in said hermetic container;
    preliminarily introducing a small amount of heat transfer medium gas into a gap between the object to which heat is transferred and said base member;
    measuring a pressure of the heat transfer medium gas in the gap;
    automatically controlling further introduction of the heat transfer medium gas into the gap depending on the measured pressure of the heat transfer medium gas so that the pressure of the heat transfer medium gas reaches a predetermined value.

16. A method according to claim 2, wherein said susceptor and the object to be processed have uniform load curved surfaces opposing each other.

17. A method according to claim 15, further comprising a step of:
    evacuating a part of the introduced heat transfer medium gas from the gas inlet pipe; and
    wherein the automatic controlling of the further introduction of the heat transfer medium gas step comprises the substep of:
    controlling an evacuation amount from the gas inlet pipe depending on the measured pressure of the heat transfer medium gas.

18. An apparatus according to claim 8, further comprising:
 means for evacuating a part of the introduced heat transfer medium gas; and
 wherein the means for automatically controlling further introduction of the heat transfer medium gas comprises:
 means for controlling an evacuation amount of the heat transfer medium gas.

19. An apparatus according to claim 8, wherein said elastic insulating film is a polyimide resin film.

20. A method according to claim 2, further comprising the step of:
 holding the object on said susceptor by urging a periphery of the susceptor by a clamp ring after the step of placing the object on the susceptor.

21. A method according to claim 20, further comprising the step of:
 maintaining a pressure of the heat transfer medium gas in the gap at 0.5 to 20 Torr while processing the object.

22. A method according to claim 20, wherein said susceptor and the object to be processed have uniform load curved surfaces opposing each other.

23. A method according to claim 1, further comprising the step of:
 holding the object on said susceptor by urging a periphery of the susceptor by a clamp ring after the step of placing the object on the susceptor.

24. A method according to claim 23, further comprising the step of:
 maintaining a pressure of the heat transfer medium gas in the gap at 0.5 to 20 Torr while processing the object.

* * * * *